United States Patent [19]

Dudczak

[11] Patent Number: 5,239,675

[45] Date of Patent: Aug. 24, 1993

[54] REDUCED NOISE INTERFERENCE DURING HANDOFF

[75] Inventor: Cary M. Dudczak, Hoffman Estates, Ill.

[73] Assignee: Motorola, Inc., Schaumburg, Ill.

[21] Appl. No.: 683,001

[22] Filed: Apr. 10, 1991

[51] Int. Cl.$^5$ .............................................. H04Q 7/00
[52] U.S. Cl. .................................. 455/33.2; 455/56.1; 455/222; 379/60
[58] Field of Search ..................................... 455/15–16, 455/33.2, 33.4, 34.1, 35.1, 36.1, 54.1, 56.1, 218, 222, 297; 379/60

[56] References Cited

U.S. PATENT DOCUMENTS

| | | | |
|---|---|---|---|
| 3,819,872 | 6/1974 | Hamrick | 379/60 |
| 4,025,853 | 5/1977 | Addeo | 455/33.1 |
| 4,229,620 | 10/1980 | Schaible | 455/33.1 |
| 4,556,760 | 12/1985 | Goldman | 379/60 |
| 4,654,879 | 3/1987 | Goldman et al. | 455/33.2 |
| 4,696,027 | 9/1987 | Bonta | 455/33.3 |
| 4,704,734 | 11/1987 | Menich et al. | 455/33.3 |
| 4,932,049 | 6/1990 | Lee | 379/60 |
| 5,001,742 | 3/1991 | Wang | 379/60 |

Primary Examiner—Reinhard J. Eisenzopf
Assistant Examiner—Andrew Faile
Attorney, Agent, or Firm—Richard A. Sonnentag; Ray J. Warren

[57] ABSTRACT

A radiotelephone system reduces noise interference during handoff by muting the audio path of a receiver employed in a target base-station (135). After receive a handoff request message, a target base-station (135) mutes the target audio path and determines if the target audio path had been enabled by an undesired interfering signal having a common SAT. If the target audio path had been enabled by a interfering signal having a common SAT, the target base-station (135) will use the SAT and the received signal strength indication (RSSI) of the desired transmission of the subscriber (125) to enable the target audio path. Once the SAT and RSSI are present and adequate, the target audio path is enabled, the source audio path is coupled to the target audio path, and the subscriber (125) is handed off from the source base-station (130) to the target base-station (135) without a third party experiencing an objectionable noise blast.

33 Claims, 6 Drawing Sheets

REDUCED NOISE INTERFERENCE DURING HANDOFF

FIELD OF THE INVENTION

The invention relates generally to cellular radiotelephone systems and more specifically to cellular radiotelephone systems having noise interference during communication handoff.

BACKGROUND OF THE INVENTION

Cellular radiotelephone systems employ radio receivers having very high sensitivities. This high sensitivity is required in radiotelephone receivers to maintain communication throughout a particular coverage area, but such high sensitivity can also result in negative system performance. In analog radiotelephone systems, particular cells are individualized employing a specific supervisory audio tone (SAT) which distinguishes voice communication channels from their surrounding neighbor voice communication channels. Receivers used in these systems detect the SAT modulated on a radio frequency (RF) carrier and couple an audio path within the receivers to land-line telephone networks accordingly. Problems arise, however, when the high sensitivity receivers detect a undesired, low-level RF carrier having a common SAT. These undesired RF carriers might occur in systems where frequency reuse is utilized, intermodulation distortion is high, and adjacent channel interference is present.

Detection of these undesired, low-level RF carriers having a common SAT presents a major problem during handoff in a cellular radiotelephone system. When the receiver receives the undesired signal, the receiver audio path is enabled, allowing barely quieted discriminator noise (due to low received signal strength) to be output to the phone line of the channel. This noise can be summed into a conversation during a channel handoff on the bridge between the source base-station and a target base-station. When the noise is summed into the conversation, an objectionable noise blast occurs.

Thus, a need exists which enables a high sensitivity receiver to complete communication handoff without substantial noise interference.

SUMMARY OF THE INVENTION

A receiver reduces noise interference during communication handoff. The receiver has a switched audio path to convey at least an audio signal to a destination telephone system. The receiver accepts a desired radio frequency signal having at least the audio signal and a coverage area identification value modulated thereon, demodulates the desired radio frequency signal to produce signals representing at least the audio signal and the coverage are identification value, and determines a signal quality value of the desired radio frequency signal. The receiver provides a predetermined coverage area value, compares the demodulated coverage area identification value to the predetermined coverage area value, disables the switched audio path, and determines when the switched audio path has been enabled by an undesired radio frequency signal. The receiver then enables the switched audio path responsive to the signal quality value determination and the comparison if the switched audio path has been enabled by an undesired radio frequency signal.

DETAILED DESCRIPTION OF THE DRAWINGS

Figure 1:
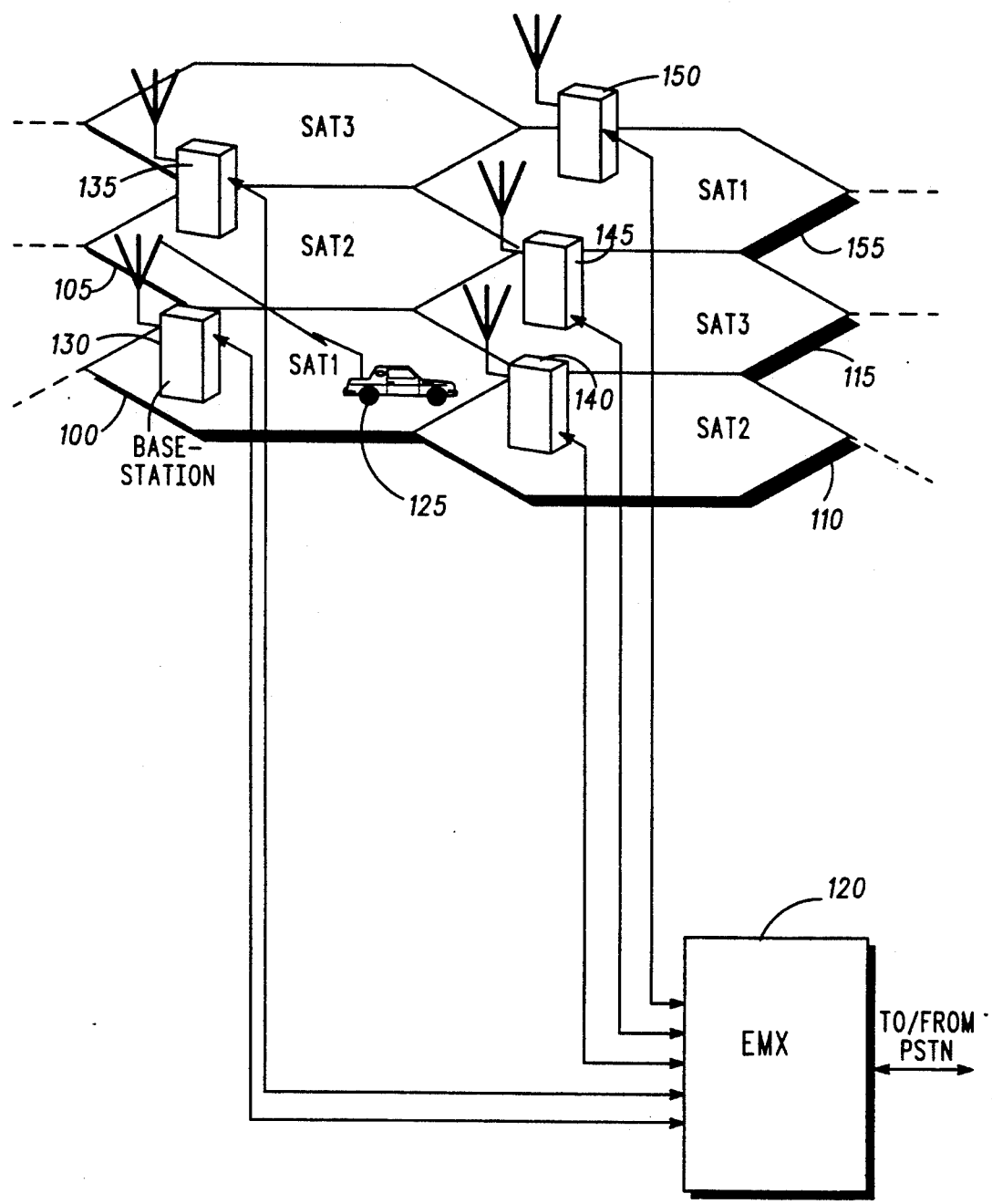

FIG. 1 generally depicts base-stations coupled to an EMX in a radiotelephone system that may be used to employ the present invention.

Figure 2:
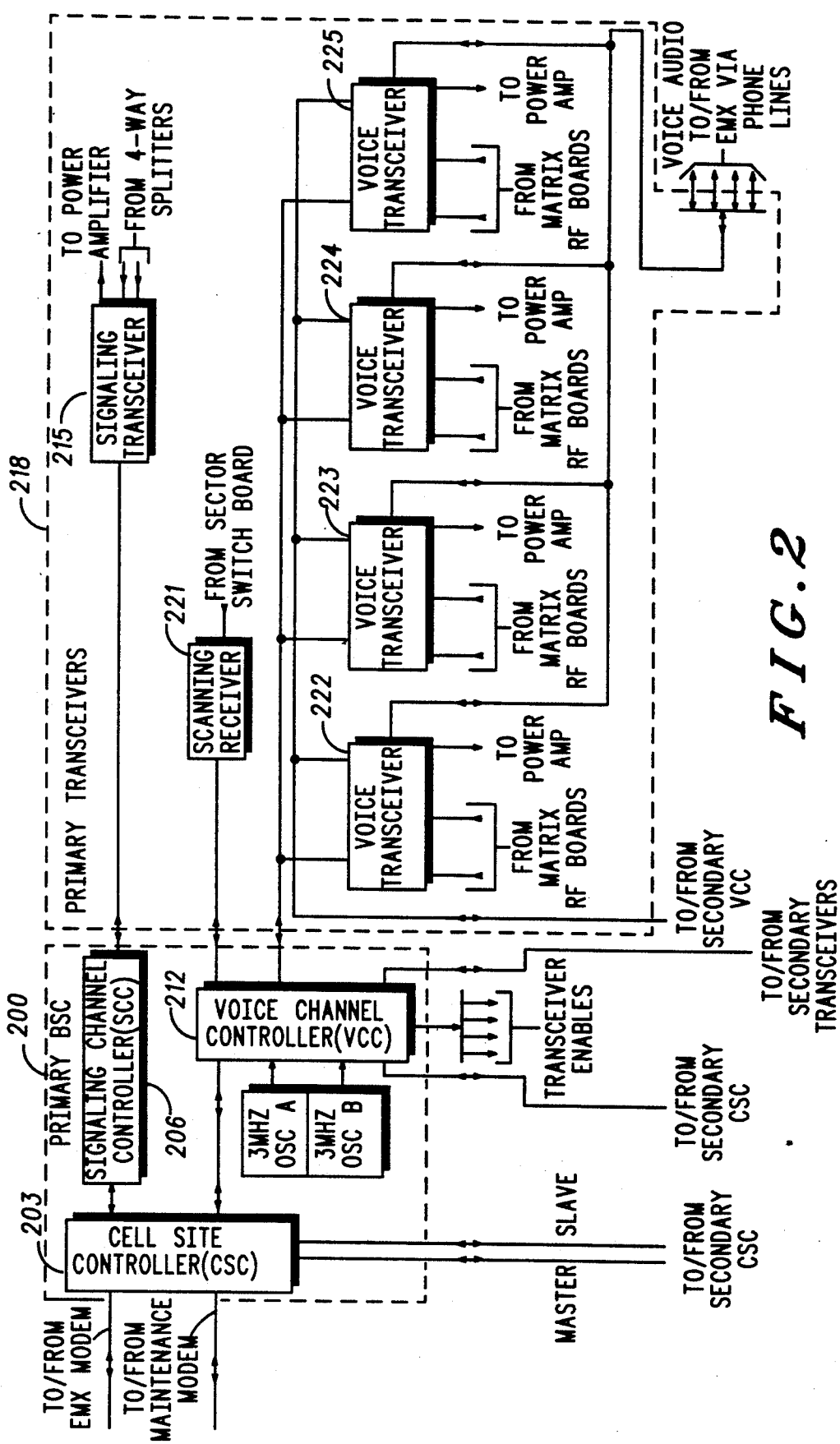

FIG. 2 generally depicts in block form a base-station controller (BSC) and transceivers located within the base-stations of FIG. 1 and used to implement the present invention.

Figure 3:
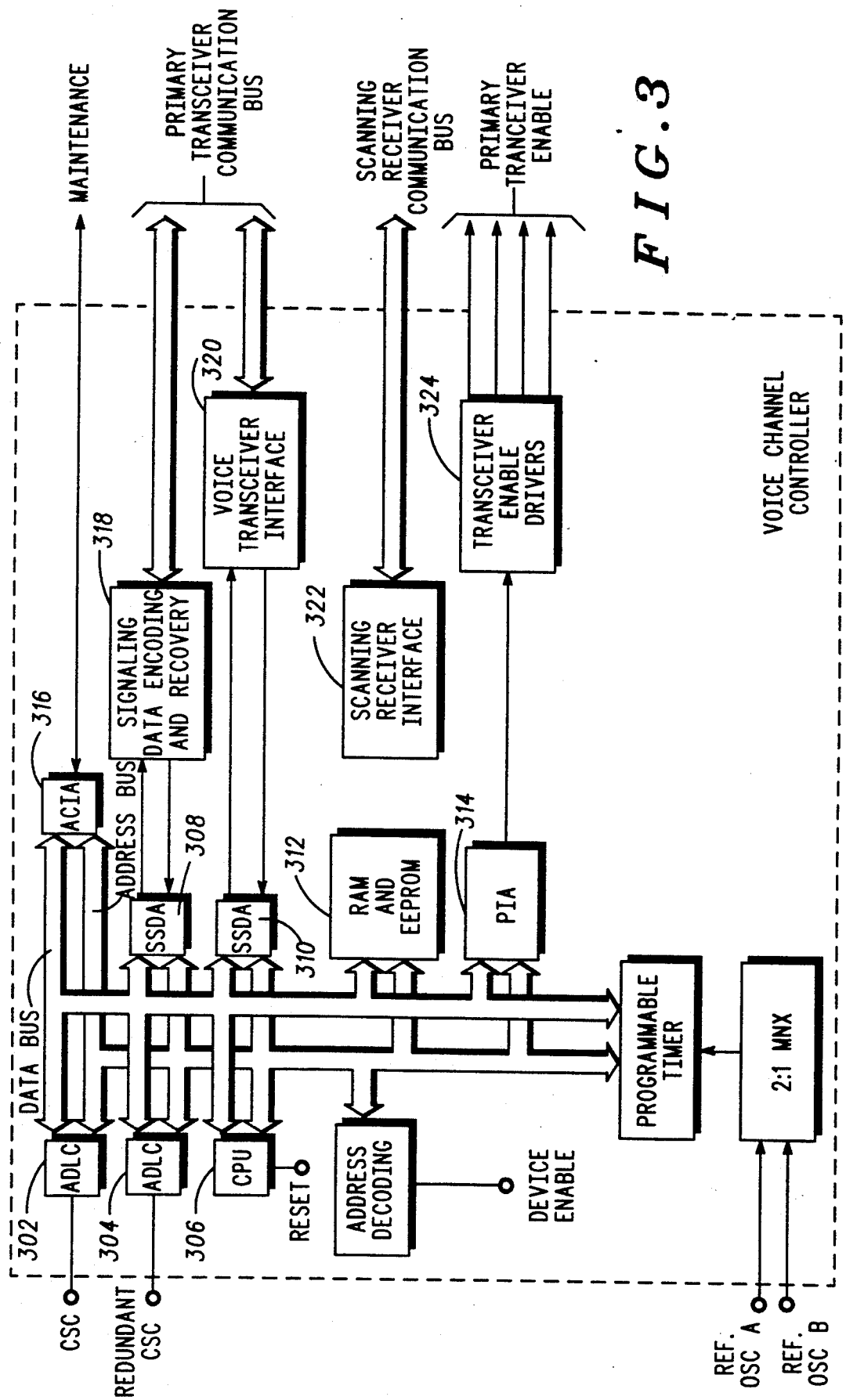

FIG. 3 illustrates a voice channel controller (VCC) located within the BSC of FIG. 2 and used to control the scanning and voice transceivers found in FIG. 2.

Figure 4:
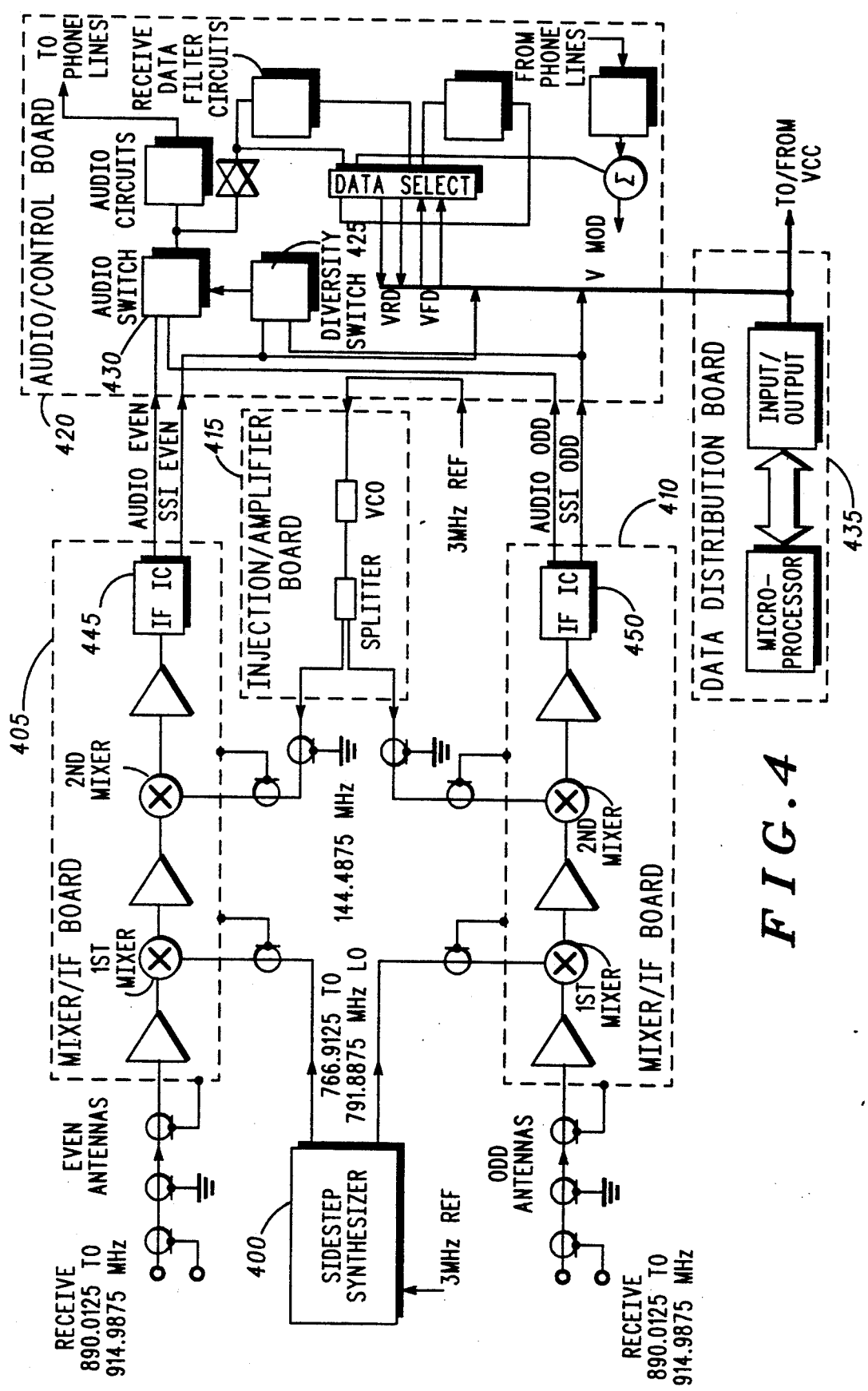

FIG. 4 generally depicts a schematic diagram of a receiver employed to demodulate a radio frequency (RF) signal and determine a received signal strength indication (RSSI) of the signal in accordance with the invention.

Figure 5:
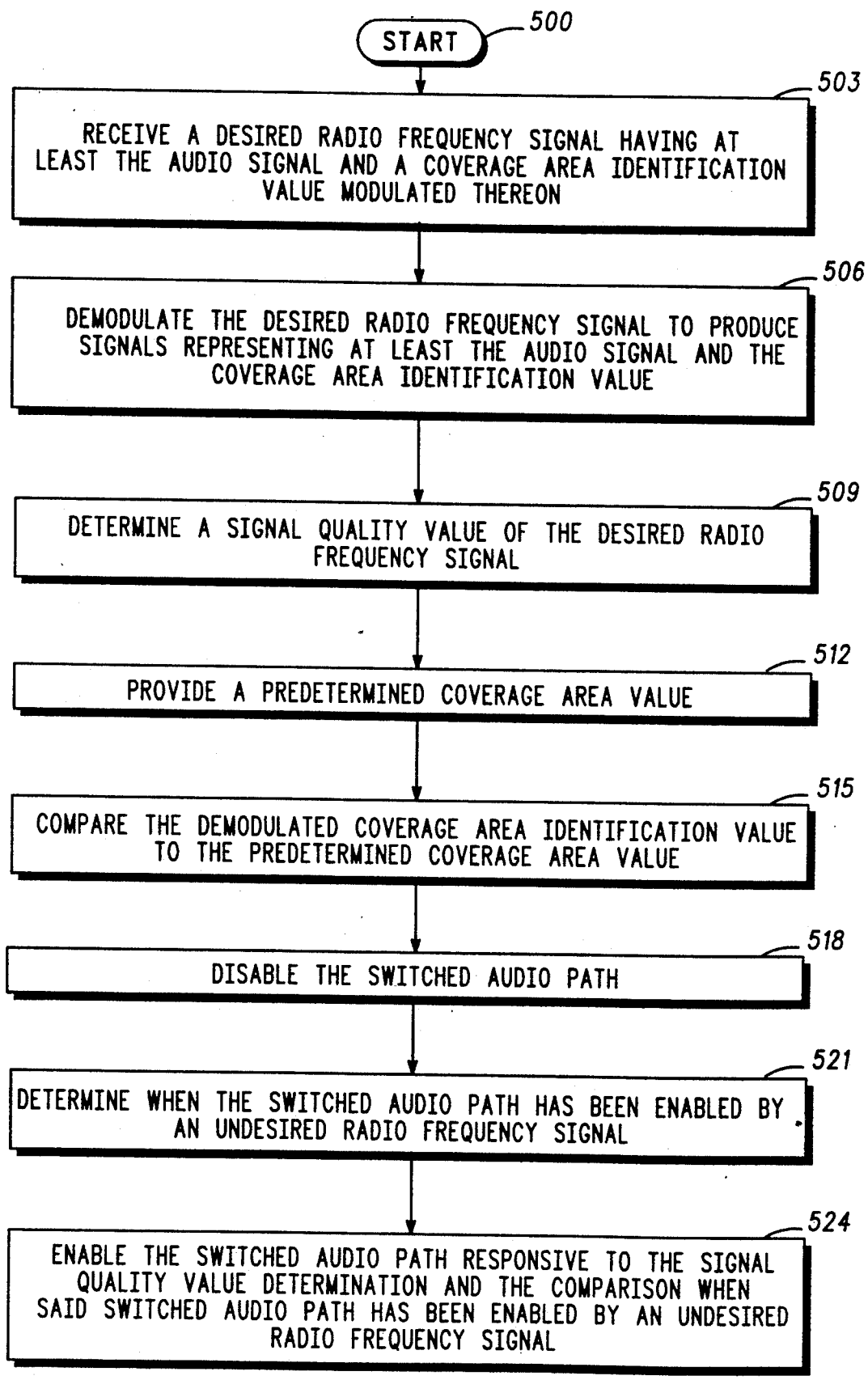

FIG. 5 generally depicts in flow diagram form the steps a base-station undergoes to reduce noise interference during handoff in accordance with the invention.

Figure 6:
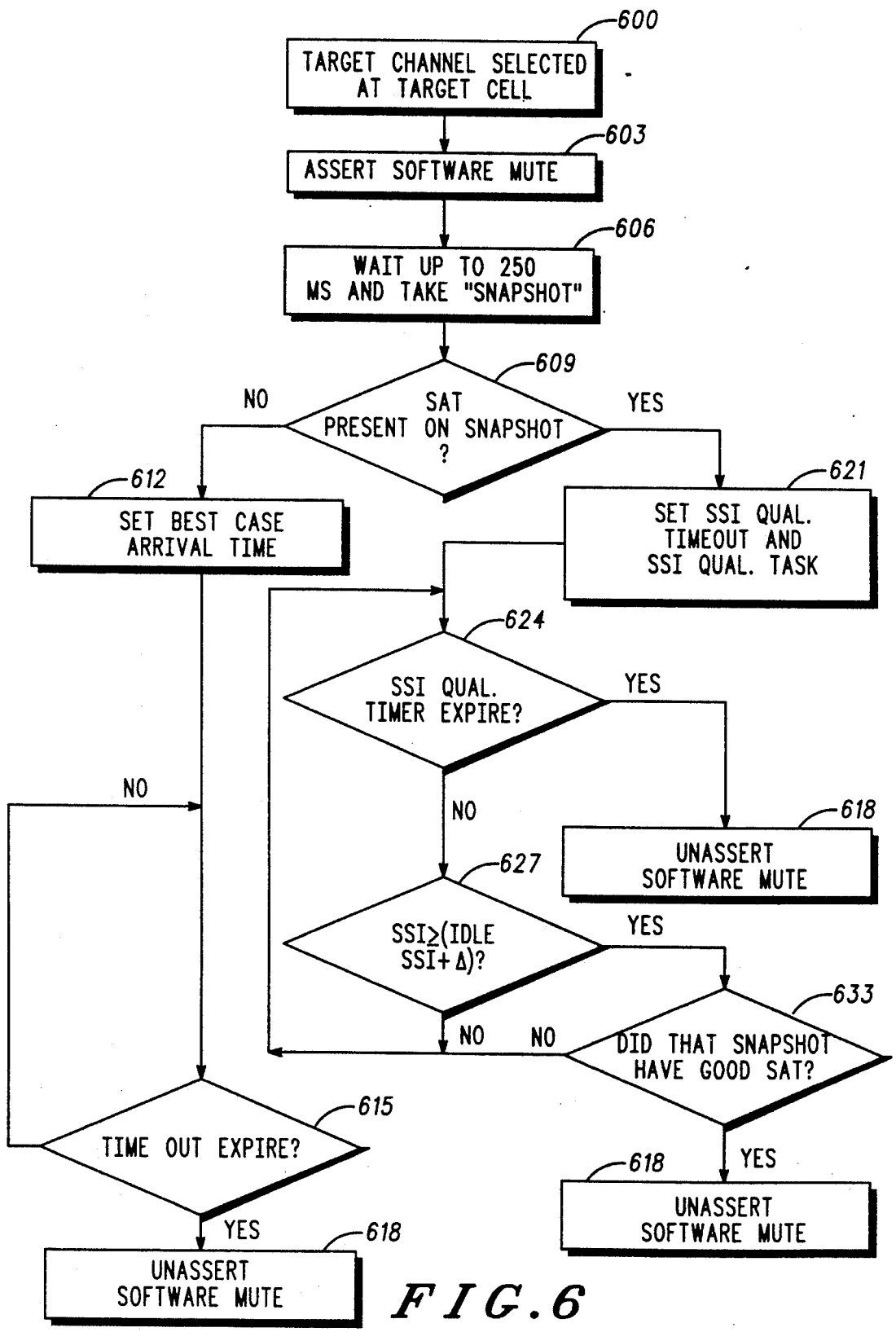

FIG. 6 generally depicts in flow diagram form the steps a base-station undergoes to confirm a mobile's arrival on a target channel in accordance with the invention.

DETAILED DESCRIPTION OF A PREFERRED EMBODIMENT

FIG. 1 generally depicts a cellular network which may employ the present invention. Cellular networks may incorporate as many different cells as is required to accommodate the coverage area. For example, a cell 100 typically covers only a small portion of the total coverage area in large cellular systems. As the cellular network grows in a particular coverage area, frequency reuse becomes an important parameter that is used to accommodate all the subscribers necessary. Returning to FIG. 1, a first coverage area or cell 100 using a supervisory audio tone of $SAT_1$ is bounded by six neighboring cells, but only two neighboring cells are shown for explanation purposes. A second coverage area or neighboring cell 105 has a SAT of $SAT_2$ while still another neighboring cell 110 has a SAT of $SAT_3$. Each of these cells has its own base-station, which is required to communicate to a subscriber 125. In the source cell 100, a source base-station 130 communicates to a subscriber 125 on a radio frequency (RF) signal. $SAT_1$ is modulated on the RF signal by the source base-station 130 and is demodulated by the subscriber 125. $SAT_1$ is used by the subscriber 125 to identify the source cell 100 the subscriber 125 is located within. In sectorized cells (not shown), a similar method of communication transfer (called a port change) is used when the subscriber 125 moves from sector to sector within a given cell.

Each base-station within a particular cell in a cellular network is connected to an EMX 120 switch, available from Motorola, Inc. and described in Motorola Instruction Manual No. 68P81054E59 published by Motorola Service Publications, Schaumburg, IL. The EMX 120, and more particularly the three party circuit (not shown) in the EMX 120, is the interface between the base-stations within the cells and the public switched telephone network (PSTN), which is the land-line system. The EMX 120 also serves as a junction point between base-stations in a cellular network. For example, as the subscriber moves throughout the source cell 100, the base-station 130 continuously monitors the received signal strength indication (RSSI) of the subscriber 125.

As the subscriber 125 moves away from the base-station 130, the RSSI of the subscriber 125 eventually falls below a transfer threshold. The source base-station 130, via the EMX 120, sends a message, which includes the source RSSI measurement, to all neighboring cells, but again for the example only neighboring cells 105, 110 are shown. If target base-stations 135, 140 receive the transmission of the subscriber 125 and if the handoff criterion is met for the particular cell 105, 110, the target base-stations 135, 140 will send a response to the EMX 120 noting such. Target base-station 135,140 will meet the handoff criterion if the RSSI measured at the target base-stations 135, 140, plus some hysteresis value is greater than the RSSI measured by the source base-station 130. The hysteresis value is used by neighboring base-stations 135, 140 to take into account the physically different locations of the target base-stations 135, 140 with respect to the source base-station 130.

At this point, the EMX 120 determines which of the target cells 105 or 110 is a better candidate for handoff. If for example, target base-station 135 in cell 105 RSSI measurement plus hysteresis was higher than that of base-station 140 in cell 110, cell 105 would be a better candidate. In this scenario, the EMX 120 sends a response to the target base-station 135 in cell 105 to determine if there is an idle channel available for communication. If there is, the target base-station 135 sets-up the channel, begins transmission and notifies the EMX 120 of the channel and SAT information. The EMX relays the channel and SAT information to the source base-station 130, the source base-station 130 instructs the subscriber unit 125 to tune to the new channel and to change SAT to SAT2, and the subscriber 125 begins to communicate to the target base-station 135 in cell 105. At this point, the subscriber 125 is determined to have arrived in cell 105 by the use of SAT2.

Each of the base-stations 130, 135, 140, 145, and 150 includes a plurality of transmitters and receivers for operating on at least one duplex signalling channel and a plurality of duplex voice channels. One conventional system employs transmitters and receivers of the type described in Motorola Instruction Manual No. 68P81058E32-A published by Motorola Service Publications, Schaumburg, IL., in 1989. FIG. 2 generally depicts transceivers and associated controlling hardware within one base-station. A base-site controller (BSC) 200 typically consists of four cards and provides the interface between base-stations 130, 135, 140, 145, and 150 within cells and the EMX 120. A BSC 200 is comprised of a cell-site controller (CSC) 203, a voice channel controller (VCC) 212, a signalling channel controller (SCC) 206, and an extend multiple port interface (EMPI) (not shown). An identical secondary set of cards can be employed to provide BSC redundancy. Together, these cards provide voice channel assignment, signalling channel control, performance monitoring, and other control functions that are used by the EMX 120 to initiate calls, determine channel allocation, and make handoff decisions.

VCC 212 controls the primary voice transceivers 222-225 and the scanning receiver 221. FIG. 3 generally depicts a block diagram of a VCC 212 which may be employed to implement the present invention. The central processing unit (CPU 306) may be a microprocessor such as MC6809 available from Motorola, Inc. This CPU 306 is used to control the primary voice channel transceivers 222-225 and scanning receiver(s) 221 in accordance with programmed steps stored in RAM and EPROM 312. In a nonredundant configuration of the present invention, VCC 212 may control up to 30 channels of radio equipment and one scanning receiver employing SSDA 310, voice transceiver interface 320, and scanning receiver interface 322. Signalling data encoding and decoding is controlled via SSDA 308 and signalling encoding and recovery interface 318. Transceivers are selected by enable drivers 324 which is controlled by CPU 306 via peripheral interface adaptors (PIA) 314. In the redundant configuration requiring two VCCs, each transceiver (being dual ported) can communicate with both VCCs. Under normal operating conditions, each VCC actively controls half of the channels while exchanging control and status messages with the other half. Interface to a redundant CSC is accomplished via ADLC 304.

A transmitted signal from a subscriber unit 125 enters one of voice transceivers 222-225 via a matrix RF board (not shown). FIG. 4 generally depicts a schematic diagram of receiver hardware employed to demodulate the transmitted signal from the subscriber 125 and determine a signal quality value or signal strength indication (SSI) of the signal. Referring to FIG. 4, the receiver has as input an even and odd signal for diversity reception purposes. An even mixer/IF board 405 accepts the even signal while an odd mixer/IF board 410 accepts the odd signal. Both mixer/IF boards 405,410 have an input from a side-step synthesizer 400 which acts as a first local oscillator (LO) for mixing purposes. An injection-/amplifier board 415 provides another input to each mixer/IF board 405,410 and acts as a second LO for mixing purposes. The IF ICs 445, 450, which in the preferred embodiment are part number TDA 1576 available from Signetics, provide limiting, quadrature detection, and amplification to yield an audio output signal which is further amplified and fed to a audio control board 420 for processing. SSI detection is performed by circuitry internal to the IF ICs 445, 450 and by discrete SSI detection range extension circuitry. The outputs of IF ICs 445, 450 individually provide linear SSI signals. These SSI signals are fed to the audio control board 420 where they are used to drive a diversity switch 425, which in turn is used to enable/disable an audio switch 430. Output from the audio switch 430 is the audio which represents the communication from the subscriber 125. This audio is output to the EMX 120 via conventional phone lines.

When the subscriber 125 reaches the boundary of the source cell 100, a communication transfer or handoff is required as the subscriber 125 enters a neighboring target cell 105. As handoff occurs, noise resulting from target channel SAT falsing may be introduced. Target channel SAT falsing appears when an interferer is present in the system with the same SAT tone as the arriving mobile. For example, cell 110 in FIG. 1 has the identical SAT tone, SAT2, as cell 105 thus, if a signal transmitted by the base-station 140 in cell 110 propagates to the point where base-station 135 in cell 105 may receive it, the probability of that transmitted signal enabling the audio lines in the receiver of base-station 135 is high. Other forms of undesired signals occur due to frequency reuse, intermodulation distortion and adjacent channel interference. The interferer can cause the SAT detector on the target channel to report a false SAT indication. The SAT falsing opens the receive audio on the target channel and introduces noise into the handoff until the desired mobile arrives on channel.

Returning to FIG. 2, voice transceivers 222-225 typically mute the audio path in response to either of two events. The first event is under hardware control. When voice transceivers 222-225 no longer detect SAT, the receive audio path is muted by enabling audio switch 430. The second event is a software controlled switch. When the audio switch 430 is enabled, the audio path in the voice transceiver 218 is muted. The switch overrides the hardware SAT detect status. Therefore, the audio path in the voice transceivers 222-225 can be forced to mute regardless of the SAT status. This function provides the basis for the target channel SAT falsing solution in accordance with the invention. An algorithm is used in the BSC 200 which has the ability to distinguish between an interferer signal and the desired mobile on the target channel. As a result, the audio path in the voice transceivers 222-225 will remain muted until it is determined that the desired unit has arrived on channel. When this occurs, the audio switch 430 will be disabled and the receive audio path in the voice transceivers 222-225 will be opened and closed based on the hardware SAT detect status.

Noise interference during handoff is reduced in accordance with the invention as follows. The subscriber 125 is continuously monitored by the source base-station 130 for SSI. The base-station 130 in cell 100 has SAT1 which distinguishes cell 100 from its neighboring cells. When the SSI being measured by the base-station 130 falls below a handoff threshold, the base-station 130 sends a handoff request message to the EMX 120. The EMX 120 sends a message to neighboring target base-stations 135, 140 in cells 105, 110 respectively. Neighboring cells surrounding the source cell 100 receive the handoff measurement request message. Continuing, base-stations 135, 140 make a SSI measurement of the transmission of the subscriber 125 and determine if the handoff criterion is met. For example, if base-station 135 in cell 105 meets the handoff criterion, the base-station 135 will send a response to the EMX 120 noting such. If the target base-stations are not viable candidates for handoff, they will not respond to the EMX 120.

At this time, the EMX 120 sends a message to the best candidate target base-station 135 requesting it to determine if an idle channel exists. If an idle channel does exist, the target base-station 135 returns a message to the EMX 120 containing the idle channel information, including channel frequency and SAT2. To complete the handoff procedure, the EMX 120 sends the idle channel information to the source base-station 130 which in turn broadcasts the information to the subscriber 125. The subscriber 125 will tune to the new channel frequency, will change SAT from SAT1 to SAT2, and begin communication to the target base-station 135 in cell 105. The three party circuit (not shown) in the EMX 120 switches the land-line connection from the audio path of the source base-station 130 to the audio path of the target base-station 135 to complete the handoff.

Previously, handoff occurred regardless of the status of the audio path of the idle target channel. If the audio path was open, discriminator noise would be summed into a conversation via the three party circuit (not shown) during handoff, resulting in an objectionable noise blast to the using parties. In accordance with the invention, the target base-station 135 mutes the audio path, determines if the audio path of the chosen idle target channel was enabled by detection of an undesired signal having a common SAT, and if it was, uses the SAT and the RSSI of the subscriber 125 transmission to enable the audio path for handoff.

If the most recent idle target channel SAT status returns a positive SAT indication, then an interferer is present on the idle target voice channel. When this occurs, the VCC 212 triggers two concurrent events: a SSI qualification time-out and the SSI qualification task. The SSI qualification time-out is a safety valve to ensure that the audio path of the idle target channel does not remain muted. This task is only executed when the interfering signal has a strong SSI and the BSC 200 is unable to distinguish the interferer from the desired subscriber 125 transmission. The time-out value represents a worst case arrival scenario, and in the preferred embodiment may be in the range from 300-2000 milliseconds.

The SSI qualification task is run by VCC 212 periodically to examine the SSI of the transmission by the subscriber 125. The SSI qualification task is intended to provide a high degree of confidence that the subscriber 125 has arrived or has begun communication on the target channel. Referring to FIG. 4, the SSI is determined by mixer/amplifier boards 405, 410 and sent to the audio control board 420 where the information is routed to the data distribution board 435 within one of the voice transceivers 222-225. The data distribution board 435 serves as the interface point between the voice transceivers 222-225 and the VCC 212. The VCC 212 compares the subscriber SSI with the interferer SSI plus a downloaded SSI offset. The downloaded SSI offset is stored in RAM and EPROM 312 and currently represents compensation for variations in signal strength of up to 7 dB. The compensation may be higher in future implementations.

If VCC 212 determines the subscriber SSI is greater than the interferer SSI plus the downloaded SSI offset, the SSI qualification time-out is cancelled, and VCC 212 sends a disable mute message to the target voice transceiver. This message enables the first positive SAT update message from the target voice transceiver to send a handoff complete message to the EMX 120. If the SSI qualification time-out expires before VCC 212 determines the subscriber SSI is greater than the interferer SSI plus the downloaded SSI offset, VCC 212 sends the same disable mute message to the target voice transceiver. Again, this message enables the first positive SAT update message from the target voice transceiver to send a handoff complete message to the EMX 120.

FIG. 5 generally depicts in flow diagram form the steps a base-station 135 undergoes to reduce noise interference during handoff in accordance with the invention. The process starts at 500 by receiving at 503 a desired RF signal having at least the audio signal and a coverage area identification value modulated thereon. The base-station 135 then demodulates at 506 the desired RF signal to produce signals representing at least the audio signal and the coverage area identification value and determines at 509 a signal quality value of the desired RF signal. A predetermined coverage area value is provided at 512 and compared at 515 to the demodulated coverage area identification value. The base-station 135 disables at 518 the switched audio path, determines at 521 when the switched audio path has been enabled by an undesired RF signal, and enables at 524 the switched audio path in response to the signal quality determination 509 and the comparison 515 when the switched audio path has been enabled by an undesired RF signal.

FIG. 6 generally depicts in flow diagram form the steps a base-station undergoes to confirm a mobile's arrival on a target channel in accordance with the invention. The process starts by selecting at 600 a target channel at a target base-station 135. The base-station 135 asserts at 603 a software mute and waits at 606 up to 250 milliseconds before taking a "snapshot" or poll of the transceiver 222-225 SSI and SAT. A test is performed at 609 to determined if SAT is present during the snapshot. If it is not present, the base-station 135 sets at 612 a best case arrival timeout and performs at 615 another test to determine if the timeout has expired. If it has, the software mute is un-asserted at 618 and handoff proceeds as normal. If it has not expired, the test at 615 is repeated until it has expired.

If SAT is present during the snapshot in test 609, a SSI qualification timeout is set at 621 and the status algorithm or SSI qualification task residing in RAM and EPROM 312 of the VCC 212 is invoked. A test is performed at 624 to determine if the SSI qualification timeout has expired. If it has, the software mute is un-asserted at 618. If has not expired, a test is performed at 627 to determine if the sampled SSI is greater than or equal to the interferer SSI plus some variable Δ. If it is not, the process proceeds back to test 624 to determine if the SSI qualification timeout has expired. If the sampled SSI is greater, the base-station determines at 633 if the snapshot had a good SAT. If it did not, the test at 624 is repeated. If it did, the software mute is un-asserted at 618 and handoff proceeds as normal. Using these steps, noise interference in the form of a noise blast is reduced during the handoff process.

What I claim is:

1. A receiver which reduces noise interference during communication handoff, the receiver having a switched audio path to convey at least an audio signal to a destination telephone system, the receiver comprising:
   means for accepting a desired radio frequency signal having at least the audio signal and a coverage area identification value modulated thereon;
   means for demodulating said desired radio frequency signal to produce signals representing at least the audio signal and said coverage area identification value;
   means for determining a signal quality value of said desired radio frequency signal;
   means for providing a predetermined coverage area value;
   means for comparing said demodulated coverage area identification value to said predetermined coverage area value;
   means for determining when said switched audio path has been enabled by an undesired radio frequency signal;
   means for disabling said switched audio path when said switched audio path has been enabled by an undesired radio frequency signal; and
   means for enabling said disabled switched audio path responsive to said means for determining a signal quality value and said means for comparing said demodulated coverage area identification value to said predetermined coverage area value.

2. The receiver of claim 1 wherein said means for determining a signal quality value of said radio frequency signal further comprises means for determining a signal strength value of said radio frequency signal.

3. The receiver of claim 2 wherein said means for determining a signal quality valve further comprises means for providing at least one communication handoff threshold.

4. The receiver of claim 3 wherein said means for enabling further comprises means for enabling the switched audio path when said signal strength value is greater than said at least one communication handoff threshold.

5. The receiver of claim 1 wherein said means for enabling further comprises means for enabling the switched audio path when said demodulated coverage area identification value essentially equals said predetermined coverage area value.

6. The receiver of claim 1 wherein said means for comparing further comprises means for comparing said demodulated coverage area identification value to one of at least a first, second, and third predetermined coverage area values.

7. The receiver of claim 6 wherein said first predetermined coverage area value is 5970 Hz, said second predetermined coverage area value is 6000 Hz, and said third predetermined coverage area value is 6030 Hz.

8. A base-station employing a receiver which reduces noise interference during communication handoff, the base-station employed in a radiotelephone system, the receiver having a switched audio path to convey at least an audio signal to a destination telephone system, the base-station comprising:
   means for receiving a desired radio frequency signal having at least the audio signal and a coverage area identification value modulated thereon;
   means for demodulating said desired radio frequency signal to produce signals representing at least the audio signal and said coverage area identification value;
   means for determining a signal quality value of said desired radio frequency signal;
   means for providing a predetermined coverage area value;
   means for comparing said demodulated coverage area identification value to said predetermined coverage area value;
   means for determining when said switched audio path has been enabled by an undesired radio frequency signal;
   means for disabling the switched audio path when said switched audio path has been enabled by an undesired radio frequency signal; and
   means for enabling said disabled switched audio path responsive to said means for determining a signal quality value and said means for comparing said demodulated coverage area identification value to said predetermined coverage area value.

9. The base-station of claim 8 wherein said means for determining a signal quality value of said radio frequency signal further comprises means for determining a signal strength value of said radio frequency signal.

10. The base-station of claim 9 wherein said means for determining a signal quality value further comprises means for providing at least one communication handoff threshold.

11. The base-station of claim 10 wherein said means for enabling further comprises means for enabling the switched audio path when said signal strength value is greater than said at least one communication handoff threshold.

12. The base-station of claim 8 wherein said means for enabling further comprises means for enabling the switched audio path when said demodulated coverage area identification value essentially equals said predetermined coverage area value.

13. The base-station of claim 8 wherein said means for comparing further comprises means for comparing said demodulated coverage area identification value to one of at least a first, second, and third predetermined coverage area values.

14. The base station of claim 13 wherein said first predetermined coverage area value is 5970 Hz, said second predetermined coverage area value is 6000 Hz, and said third predetermined coverage area value is 6030 Hz.

15. A radiotelephone system having reduced noise interference during communication handoff, the radiotelephone system having a source base-station communicating with a subscriber unit in a first coverage area, the source base-station having a source audio path to convey an audio signal, the subscriber unit requiring communication handoff from the source base-station to a target base-station in a second coverage area, the target base-station having a target audio path to convey an audio signal, the radiotelephone system comprising:
means, at the target base-station, for receiving a desired radio frequency signal having at least a coverage area identification value modulated thereon;
means, at the target base-station, for demodulating said desired radio frequency signal to produce at least one signal representing said coverage area identification value;
means, at the target base-station, for determining a signal quality value of said desired radio frequency signal;
means, at the target base-station, for providing a predetermined coverage area value;
means, at the target base-station, for comparing said demodulated coverage area identification value to the predetermined coverage area value;
means, at the target base-station, for determining when said target audio path has been enabled by an undesired radio frequency signal;
means, at the target base-station, for disabling the target audio path when said switched audio path has been enabled by an undesired radio frequency signal;
means, at the target base-station, for enabling said disabled target audio path responsive to said means for determining a signal quality value and said means for comparing said demodulated coverage area identification value to the predetermined coverage area value; and
means for coupling said source audio path to said enabled target audio path.

16. The radiotelephone system of claim 15 wherein said means for determining a signal quality value of said radio frequency signal further comprises means for determining a signal strength value of said radio frequency signal.

17. The radiotelephone system of claim 16 wherein said means for determining a signal quality value further comprises means for providing at least one communication handoff threshold.

18. The radiotelephone system of claim 17 wherein said means for enabling further comprises means for enabling the target audio path when said signal strength value is greater than said at least one communication handoff threshold.

19. The radiotelephone system of claim 15 wherein said means for enabling further comprises means for enabling the target audio path when said demodulated coverage area identification value essentially equals said predetermined coverage area value.

20. The radiotelephone system of claim 15 wherein said means for comparing further comprises means for comparing said demodulated coverage area identification value to one of at least a first, second, and third predetermined coverage area values.

21. The radiotelephone system of claim 20 wherein said first predetermined coverage area value is 5970 Hz, said second predetermined coverage area value is 6000 Hz, and said third predetermined coverage area value is 6030 Hz.

22. A method of reducing noise interference during communication handoff in a base-station, the base-station employed in a radiotelephone system and incorporating a receiver having a switched audio path to convey at least an audio signal to a destination telephone system, the method comprising the steps of:
receiving a desired radio frequency signal having at least the audio signal and a coverage area identification value modulated thereon;
demodulating said desired radio frequency signal to produce signals representing at least the audio signal and said coverage area identification value;
determining a signal quality value of said desired radio frequency signal;
providing a predetermined coverage area value;
comparing said demodulated coverage area identification value to said predetermined coverage area value;
determining when said switched audio path has been enabled by an undesired radio frequency signal;
disabling said switch audio path when said switched audio path has been enabled by an undesired radio frequency signal; and
enabling said disabled switched audio path responsive to said step of determining a signal quality value and said step of comparing said demodulated coverage area identification value to said predetermined coverage area value.

23. The method of claim 22 wherein said step of determining a signal quality value of said radio frequency signal further comprises the step of determining a signal strength value of said radio frequency signal.

24. The method of claim 23 wherein said step of determining further comprises the step of providing at least one communication handoff threshold.

25. The method of claim 24 wherein said step of enabling further comprises the step of enabling the switched audio path when said signal strength value is greater than said at least one communication handoff threshold.

26. The method of claim 22 wherein said step of enabling further comprises the step of enabling the switched audio path when said demodulated coverage area identification value essentially equals said predetermined coverage area value.

27. The method of claim 22 wherein said step of comparing further comprises the step of comparing said demodulated coverage area identification value to one of at least a first, second, and third predetermined coverage area values and wherein said first predetermined coverage area value is 5970 Hz, said second predetermined coverage area value is 6000 Hz, and said third predetermined coverage area value is 6030 Hz.

28. A method of reducing noise interference during communication handoff in a radiotelephone system, the radiotelephone system having a source base-station communicating with a subscriber unit in a first coverage area, the source base-station having a source audio path to convey an audio signal, the subscriber unit requiring communication handoff from the source base-station to a target base-station in a second coverage area, the target base-station having a target audio path to convey an audio signal, the method comprising the steps of:

receiving, at the target base-station, a desired radio frequency signal having at least a coverage area identification value modulated thereon;

demodulating, at the target base-station, said desired radio frequency signal to produce at least one signal representing said coverage area identification value;

determining, at the target base-station, a signal quality value of said desired radio frequency signal;

providing, at the target base-station, a predetermined coverage area value;

comparing, at the target base-station, said demodulated coverage area identification value to the predetermined coverage area value;

determining, at the target base-station, when said target audio path has been enabled by an undesired radio frequency signal;

disabling, at the target base-station, the target audio path when said switched audio path has been enabled by an undesired radio frequency signal;

enabling, at the target base-station, said disabled target audio path responsive to said step of determining a signal quality value and said step of comparing said demodulated coverage area identification value to the predetermined coverage area value; and coupling said source audio path to said enabled target audio path.

29. The method system of claim 28 wherein said step of determining a signal quality value of said radio frequency signal further comprises the step of determining a signal strength value of said radio frequency signal.

30. The method system of claim 29 wherein said step of determining a signal quality value further comprises the step of providing at least one communication handoff threshold.

31. The method system of claim 30 wherein said step of enabling further comprises the step of enabling the target audio path when said signal strength value is greater than said at least one communication handoff threshold.

32. The method system of claim 28 wherein said step of enabling further comprises the step of enabling the target audio path when said demodulated coverage area identification value essentially equals said predetermined coverage area value.

33. The method system of claim 28 wherein said step of comparing further comprises the step of comparing said demodulated coverage area identification value to one of at least a first, second, and third predetermined coverage area values and wherein said first predetermined coverage area value is 5970 Hz, said second predetermined coverage area value is 6000 Hz, and said third predetermined coverage area value is 6030 Hz.

* * * * *